United States Patent
Boemmel et al.

(10) Patent No.: US 6,822,453 B2
(45) Date of Patent: Nov. 23, 2004

(54) SHIM TRAY, AND GRADIENT COILS SYSTEM AND MAGNETIC RESONANCE APPARATUS FOR THE ACCEPTABLE OF THE SHIM TRAY

(75) Inventors: Franz Boemmel, Erlangen (DE); Udo Franzke, Uttenreuth-Weiher (DE)

(73) Assignee: Siemens Aktiengesellschaft, München (DE)

( * ) Notice: Subject to any disclaimer, the term of this patent is extended or adjusted under 35 U.S.C. 154(b) by 0 days.

(21) Appl. No.: 10/402,265

(22) Filed: Mar. 28, 2003

(65) Prior Publication Data

US 2003/0222650 A1 Dec. 4, 2003

(30) Foreign Application Priority Data

Mar. 28, 2002 (DE) .......................................... 102 14 112

(51) Int. Cl.⁷ .................................................. G01V 3/00
(52) U.S. Cl. ....................................... 324/320; 324/319
(58) Field of Search ................................. 324/320, 319, 324/318, 309; 335/299; 128/653.5

(56) References Cited

U.S. PATENT DOCUMENTS

| | | | |
|---|---|---|---|
| 5,005,266 A | * | 4/1991 | Fister et al. ................. 24/601.5 |
| 5,168,231 A | | 12/1992 | Aubert |
| 5,532,597 A | * | 7/1996 | McGinley et al. ........... 324/319 |
| 5,550,472 A | * | 8/1996 | Richard et al. ............... 324/320 |
| 5,786,695 A | * | 7/1998 | Amor et al. .................. 324/320 |
| 5,923,235 A | | 7/1999 | Van Oort |
| 5,999,076 A | | 12/1999 | Becker, Jr. et al. |

* cited by examiner

*Primary Examiner*—Brij B. Shrivastav
(74) *Attorney, Agent, or Firm*—Schiff Hardin LLP

(57) ABSTRACT

In a shim tray, a gradient coil system and a magnetic resonance apparatus for the acceptance of the shim tray, the shim tray is sub-divided, in the direction of insertion into the gradient coil system or the magnetic apparatus into at least two sub-trays that can be released from one another.

18 Claims, 4 Drawing Sheets

SHIM TRAY, AND GRADIENT COILS SYSTEM AND MAGNETIC RESONANCE APPARATUS FOR THE ACCEPTABLE OF THE SHIM TRAY

BACKGROUND OF THE INVENTION

1. Field of the Invention

The present invention is directed to a shim tray for holding laminae of a passive shim system for a magnetic resonance apparatus. The invention also is directed to a gradient coils system for accepting such a shim tray, as well as to a magnetic resonance apparatus for accepting such a shim tray.

2. Description of the Prior Art

Magnetic resonance technology is a known technology for, among other things, acquiring images of the inside of the body of an examination subject. In a magnetic resonance apparatus, rapidly switched gradient fields that are generated by a gradient coil system are superimposed on a static basic magnetic field that is generated by a basic field magnet. The magnetic resonance apparatus also has a radio-frequency system that emits radio-frequency signals into the examination subject for triggering magnetic resonance signals and picks up the magnetic resonance signals, on the basis of which magnetic resonance images are produced.

A high homogeneity of the basic magnetic field is an important factor for the quality of the magnetic resonance images. Inhomogeneities of the basic magnetic field within a homogeneity volume of the magnetic resonance apparatus cause geometrical distortions of the magnetic resonance image that are proportional to the inhomogeneities. The fat-water separation is also important in this context. An RF pulse without gradient activation is emitted at the frequency of the hydrogen in the fat. The protons excited in this way only slowly return back into the field direction and therefore cannot be re-excited for a certain time. Images acquired during this time thus shown no fat but only water. To this end, however, the homogeneity in the imaging volume must be better than 1 ppm peak-peak since the distance of the fat line from the water line amounts to approximately 3 ppm. Arrangements referred to as shim systems are employed for improving the basic magnetic field homogeneity within the homogeneity volume. A distinction is made between passive and active shim systems. In a passive shim system, a number of laminae composed of a magnetic material, particularly a ferromagnetic iron alloy, are attached in the examination space of the magnetic resonance apparatus in a suitable arrangement. To that end, the basic magnetic field is measured within the homogeneity volume before the attachment of the laminae. Using the measured values, a computer program determines the suitable number and arrangement of the laminae.

For example, U.S. Pat. No. 5,635,839 discloses a hollow-cylindrical gradient coil system of a magnetic resonance apparatus that has shim receptacles with a cross section having the shape of an annular segment, that are continuous in the axial direction. Corresponding shim trays are thereby insertable into the shim tray receptacles, the length of the shim trays being equal to a length of the gradient coil system and the shim trays being subdivided into corresponding shim pockets for the acceptance of ferromagnetic laminae.

Further, for example, U.S. Pat. No. 5,786,695 discloses that the introduction and removal of shim trays filled with shim laminae into or out of shim tray receptacles must ensue with the basic magnetic field turned off according to regulations. If the introduction and removal were to be undertaken inadvertently with the basic magnetic field turned on, then the shim tray disclosed in U.S. Pat. No. 5,786,695 is fashioned such that a cover of the shim tray is secured against the forces at the rest of the shim tray acting on the shim laminae.

Particularly in the case of a magnetic resonance apparatus having a tunnel-shaped examination space, a support mechanism can be introduced into and removed from the examination space through a first opening of the end of the space. Adequate space adjoining the first opening must be provided for an installation room of the magnetic resonance apparatus, so that a complete removal of the support mechanism from the examination space can be unproblemmatically implemented. By contrast, the magnetic resonance apparatus can be constructed with a second opening of the examination space lying opposite the first opening that has a comparatively small distance from a limiting surface of the installation room. In many instances, this prevents installation of shim trays that, corresponding to the length of the gradient coil system, have a length of one meter or more proceeding from a side of the second opening. So that the shim trays can be introduced regardless of the installation condition, the magnetic resonance apparatus together with the movable support mechanism usually is designed such that introduction is possible proceeding from the side of the first opening.

SUMMARY OF THE INVENTION

An object of the present invention is to provide a shim tray, a gradient coil system and a magnetic resonance apparatus for the acceptance of the shim tray such that, among other things, a simple manipulation of the shim tray is achieved.

This object is achieved in a shim tray that is divided in a direction of insertion into at least two shim sub-trays that can be released from one another.

As a result, an insertion and removal of the sub-trays filled with shim laminae into or, respectively, out of the shim tray receptacle can be implemented as a normal procedure when the basic magnetic field to be shimmed is activated. The reason for this is that, compared to a comparable, undivided shim tray, the magnetic forces acting on the sub-trays only amount to a fraction. Advantageously, thus, a shut-down of the basic magnetic field is not necessary for the introduction and removal of the sub-trays. The introduction and removal of the sub-trays can thereby be implemented with a comparatively slight exertion of force and can be supported by a suitably designed device. With the basic magnetic field activated, further, the sub-trays filled with shim laminae can be carried or transported past a basic field magnet generating the basic magnetic field in the influencing region of the basic magnetic field, for example at a distance of approximately 50 cm. As a result, a general risk of accidents is reduced. Compared to a comparable, undivided shim tray, further, the space required for the introduction and removal of the sub-trays is significantly reduced, for example a distance between an opening of the shim tray receptacle and a wall of a shielded compartment. Due to the shortness of the sub-trays, further, lower tool costs are incurred in the manufacture, and the sub-trays can be manufactured with a higher precision.

In a preferred embodiment, the shim tray is fashioned with a cross-section corresponding to an annular segment for the insertion into a shim tray receptacle. For the acceptance of shim laminae, the shim tray has at least one shim pocket having a cross-section corresponding to a rectangle. The shim tray is fashioned such that, given a maximum area content of the rectangle, the rectangle is arranged within the annular segment such that a circumferential line of the rectangle touches a circumferential line of the annular segment in exactly three points.

As a result, and compared to known shim tray receptacles and shim trays, either a greater maximum shim effect can be achieved with the same available space for shim tray receptacles or the space required for shim tray receptacles can be reduced with the same maximum shim effect.

The above object also is achieved in a gradient coil system of a magnetic resonance apparatus for accepting a shim tray as described above. The above object also is achieved in a magnetic resonance apparatus for accepting such a shim tray.

DESCRIPTION OF THE PREFERRED EMBODIMENTS

Figure 1:
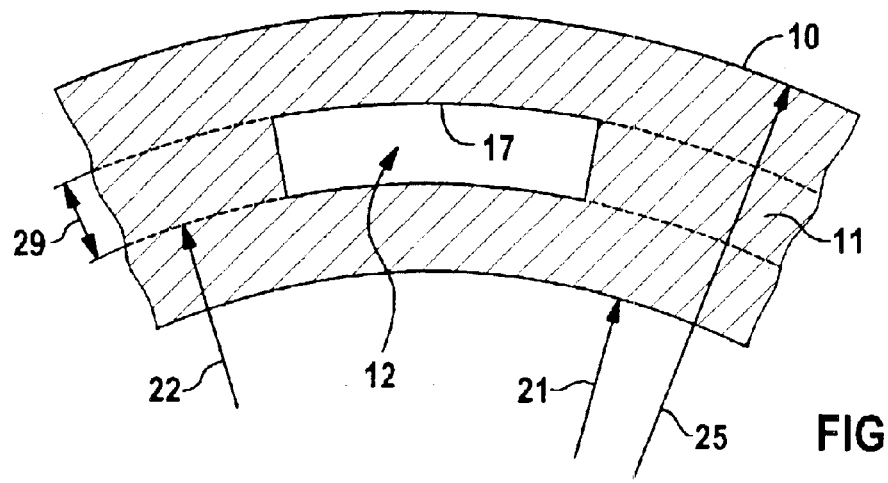
FIG. 1 is a cross-section through a portion of hollow-cylindrical gradient coil system with a shim tray receptacle having an annular segment-shaped cross-section in accordance with the invention.

As an exemplary embodiment of the invention, FIG. 1 shows a cross-section through a portion of a hollow-cylindrical gradient coil system 10 having a shim tray receptacle 12 that has a continuous, unchanging cross-section in the axial direction that corresponds to an annular segment 17. The gradient coil system has an inside radius 21 of approximately 700 mm and an outside radius 25 of approximately 900 mm. A hollow-cylindrical region 11 indicated with broken lines inside the gradient coil system 10, having an inside radius 22 of approximately 800 and a thickness 29 of approximately 22 mm, is provided for forming a shim tray receptacle 12. (Multiple receptacles 21 are formed in the complete gradient coil system 10) The hollow-cylindrical region 11 is arranged between the gradient coils at one side and the shield coils arranged farther toward the outside at the other side. Further, the gradient coil system 10 is cast with casting resin and includes parts of a cooling device as well as parts of an active shim system.

Figure 2:
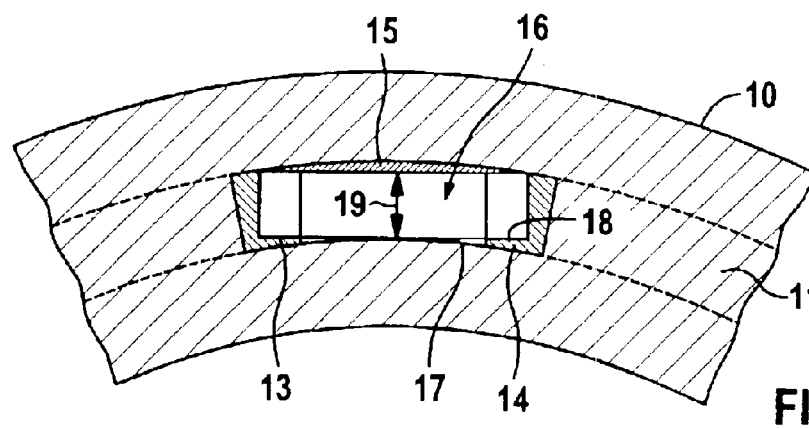
FIG. 2 shows the portion of the gradient coil system of FIG. 1 with a shim tray inserted into the shim tray receptacle.

As an exemplary embodiment of the invention, FIG. 2 shows the portion from FIG. 1 with a shim tray 13 inserted into the shim tray receptacle 12, the shim tray 13 being composed of at least two sub-trays, each sub-tray 14 that being closable with a cover 15. Each sub-tray 14 has shim pockets 16, each of the shim pockets 16 having a cross-section corresponding to a rectangle 18. Each of the shim pockets 16 can be maximally filled with shim laminae up to a height 19. The shim tray 13 and the sub-trays 14 thereof are fashioned such that, given a maximum area content of the rectangle 18, the rectangle 18 is arranged within the annular segment 17 so that a circumferential line of the rectangle 18 touches a circumferential line of the annular segment 17 at exactly three points.

Figure 3:
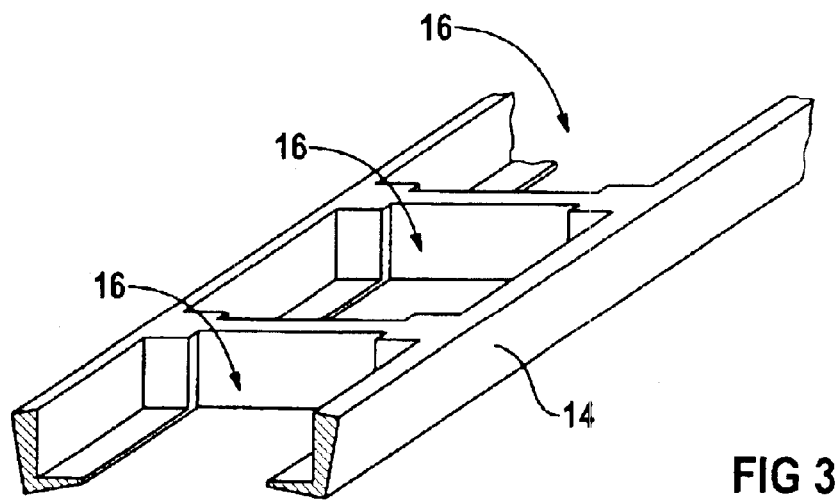
FIG. 3 is a perspective view showing a basic box unit of the shim tray of FIG. 2.

FIG. 3 shows a portion of a sub-tray 14 of FIG. 2 without the cover 15 and in a perspective view. The a sub-tray 14 is subdivided into the shim pockets 16 in the axial direction that can be filled with shim laminae of magnetic material according to the inhomogeneities of the basic magnetic field to be corrected.

Figure 4:
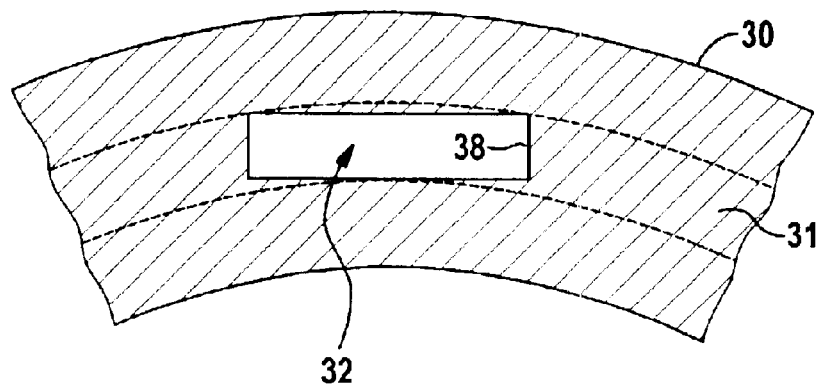
FIG. 4 is a cross-section through a portion of a hollow-cylindrical shaped gradient coil system having a shim tray receptacle with a rectangular cross-section according to the prior art.

For comparison, FIG. 4 shows a cross-section through a portion of a known hollow-cylindrical gradient coil system 30 having a known shim tray receptacle 32. The shim tray receptacle 32 has a continuous unchanging cross-section in the axial direction corresponding to a rectangle 32. The description from FIG. 1 applies correspondingly for the radii of the gradient coil system as well as a hollow-cylindrical region 31 (indicated with broken lines) for shim tray receptacles.

Figure 5:
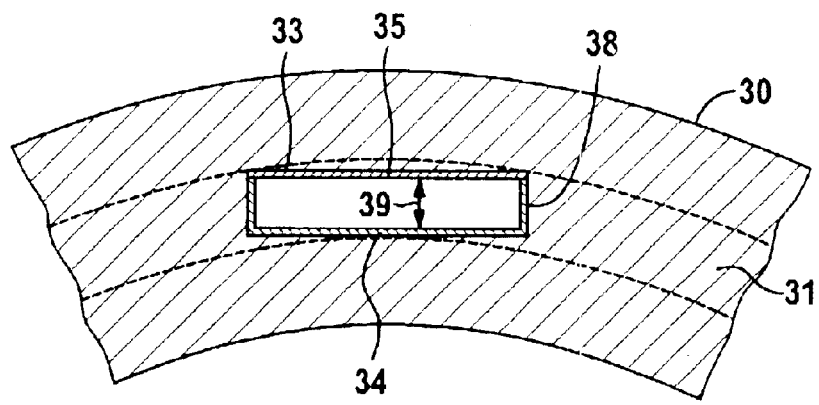
FIG. 5 shows the portion of the gradient coil of FIG. 4 with a shim tray inserted into the shim tray receptacle according to the prior art.

For comparison, FIG. 5 shows the excerpt of FIG. 4 with a shim tray 33 inserted into the shim tray receptacle 32 according to the prior art. Like the shim tray receptacle 32, the shim tray 33 comprises a cross-section corresponding to a rectangle 38. The shim tray 33 has a basic box unit 34 that can be closed with a cover 35. The length of the shim tray 33 approximately corresponds to the length of the gradient coil system 30. Filling of the shim tray 33 with shim laminae of magnetic material is thereby maximally possible to a height 39.

Figure 6:
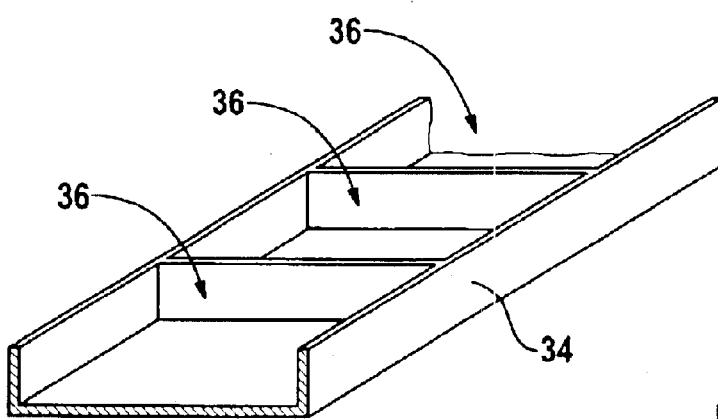
FIG. 6 is a perspective view showing a basic box unit of the shim tray of FIG. 5 according to the prior art.

Again for comparison, FIG. 6 shows a portion of the basic box unit 34 of FIG. 5 without the cover 35 and in a perspective view. The basic box unit 34 is subdivided in the axial direction into shim pockets 36 that can be filled with a number of shim laminae of magnetic material according to the inhomogeneities of the basic magnetic field to be corrected until the maximum height 39 has been reached.

Given the same thickness 29 of the hollow-cylindrical regions 11 and 31, the fashioning of the shim tray 13 and of the shim tray receptacle achieve a volume available for shim laminae, particularly an available height 19, is enlarged compared to a height 39 available in the prior art, and inhomogeneities of the basic magnetic field thus can be corrected over a broader scope.

In another embodiment for achieving an identical maximum shim effect, the hollow-cylindrical region 11 can be implemented with a lower thickness 29 compared to the region 31, so that, for example, an examination space with a larger diameter can be achieved in a magnetic resonance apparatus or, when the diameter of the examination space remains the same, an inside diameter of a hollow-cylindrical basic field magnet can be made smaller, which yields considerable cost advantages, particularly in the case of a superconducting basic field magnet.

Figure 7:
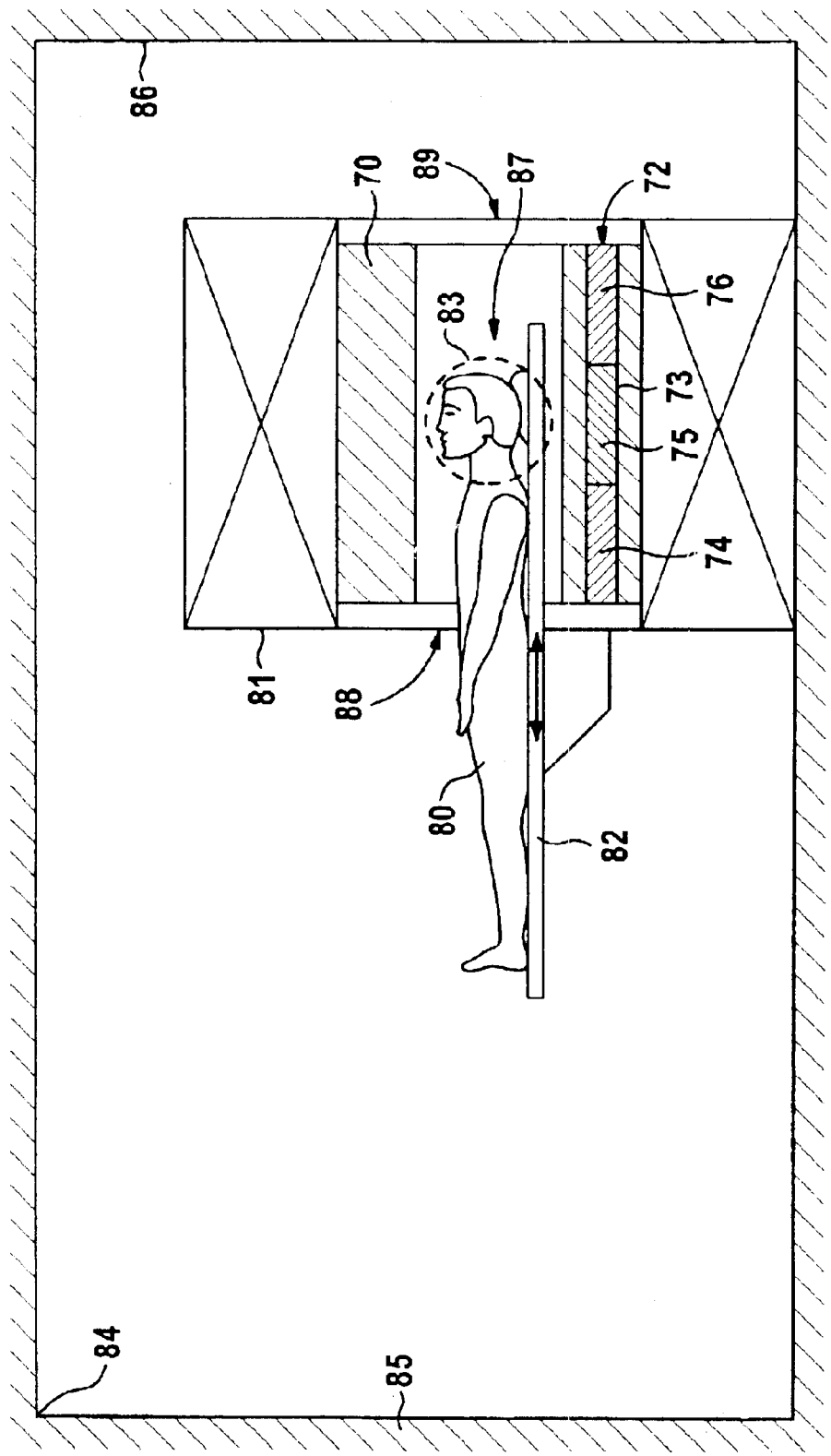
FIG. 7 is a longitudinal section through a magnetic resonance apparatus with a shim tray composed of three sub-trays.

As an exemplary embodiment of the invention, FIG. 7 shows a longitudinal section through a magnetic resonance apparatus with a shim tray 73 composed of three sub-trays 74, 75, 76. For generating a static, optimally uniform basic magnetic field within a spherical homogeneity volume 83 of the magnetic resonance apparatus, the magnetic resonance apparatus has a superconducting, essentially hollow-cylindrical basic field magnet 81. For generating gradient fields, the magnetic resonance apparatus has a likewise essentially hollow-cylindrical gradient coil system 70 that is arranged in a hollow of the basic field magnet 81. A hollow opening of the gradient coil system 70 essentially forms the limitation of a tunnel-shaped examination space 87. For introducing an examination subject, for example a patient 80, into the examination space 87, the magnetic resonance apparatus has a movable support mechanism 82 that is secured to the basic field magnet 81.

The components 70, 81 and 82 of the magnetic resonance apparatus described above are arranged in a shielded compartment 84. A first opening 88 of the tunnel-shaped examination space 87 through which the support mechanism 82 can be moved in and out, has a spacing from a left wall 85 of the shielded compartment 84 so that the support mechanism 82 can be completely moved out of the examination space 87. Thus, the patient 80 can lie or can be placed comfortably onto the support mechanism 82. By contrast, a second opening 89 of the tunnel-shaped examination space 87 lying opposite the first is arranged at a distance from a right wall 86 of the shielded compartment that only allows the support mechanism 82 to be moved out so far through the second opening 89 that, for example, whole-body imagings and/or angiographies of peripheral vessels of the patient 80 can still be implemented.

Further components of the magnetic resonance apparatus, for example a radio-frequency antenna arranged in the hollow of the gradient coil system 70, are not shown since they are well known.

The gradient coil system 70 has at least one shim tray receptacle 72 into which a shim tray 73 composed of the three sub-trays 74, 75, 76 that are releasable from one another can be introduced proceeding from the side of the second opening 89. Each of the sub-trays 74, 75 and 76 and the gradient coil system 70 are fashioned corresponding to the shim tray 13 and gradient coil system 10 shown in FIGS. 1 through 3 or corresponding to the shim tray 33 and gradient coil system 30 shown in FIGS. 4 through 6.

The tripartite division of the shim tray 73 is designed such that the middle sub-tray 75 that is arranged in the region of the homogeneity volume 83 is optimally long for a good compensation of inhomogeneities within the homogeneity volume 83 and all sub-trays 74, 75 and 76 are designed such that they can be introduced proceeding from the side of the second opening 89. Thus, they can be introduced into and removed from the shim tray receptacle 72 when filled with shim laminae and with an activated basic magnetic field and can be carried past the basic field magnet 81 within the shielded compartment with the basic magnetic field activated.

Introduction is enabled due to the tripartite division of the shim tray 73 only because of the slight distance between the second opening 89 of the examination space 87 and the right wall 86 of the shielded compartment. Since a possible introduction of shim trays proceeding from the side of the first opening 88 need not be taken into consideration in the design of the support mechanism 82, new degrees of design freedom—among other things—advantageously exist for the support mechanism 82 secured to the basic field magnet 81.

Figure 8:
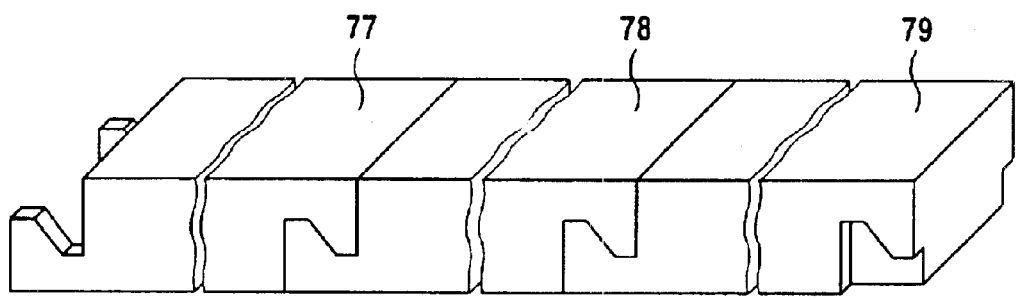
FIG. 8 is a perspective view of sub-trays that are connectable to one another as a result of their shaping.

FIG. 8 shows a perspective view of sub-trays 77, 78 and 79 that are connectable to one another on the basis of their shaping, so that, for example upon introduction into a shim tray receptacle, the sub-trays 77, 78 and 79 can be assembled inter-engaging with one another. The shaping is designed at the longitudinal ends of the sub-trays 77, 78 and 79 so that the sub-rays 78 and 79 are also pulled along toward the left in longitudinal direction out of the shim tray receptacle together with a pulling of, for example, the sub-tray 77.

Although modifications and changes may be suggested by those skilled in the art, it is the intention of the inventors to embody within the patent warranted hereon all changes and modifications as reasonably and properly come within the scope of their contribution to the art.

What is claimed is:

1. A shim tray adapted for insertion, in an insertion direction, into a receptacle, said shim tray being divided along said insertion direction into a plurality of sub-trays, the respective sub-trays in said plurality of said sub-trays being disposed in succession along said insertion direction with adjacent sub-trays being releasably connected to each other for allowing individual removal of respective sub-trays from said receptacle.

2. A shim tray as claimed in claim 1 adapted for insertion into an annular segment forming said receptacle, and wherein said shim tray has a cross-section corresponding to said annular segment, and wherein said shim tray contains at least one pocket adapted to receive shim laminae, said pocket having a cross-section, corresponding to a rectangle, and wherein said shim tray, for a maximum area content of said rectangle, is adapted to be received within said receptacle with a circumferential line of said rectangle touching a circumferential line of said annular segment in exactly three points.

3. A shim tray as claimed in claim 1 wherein said receptacle is disposed a distance from a limiting surface, and wherein at least one of said sub-trays has dimensions dependent on said distance allowing introduction and removal of said at least one of said sub-trays into and out of said receptacle.

4. A shim tray as claimed in claim 1 wherein at least one of said sub-trays has a size adapted to be maximally filled with shim laminae for shimming a magnetic field, and wherein said size of said at least one of said sub-trays when maximally filled with said shim laminae allows said at least of said shim trays to be introduced and removed from said receptacle with said magnetic field activated.

5. A shim tray as claimed in claim 1 wherein at least one of said sub-trays has a size adapted to be maximally filled with shim laminae for shimming a magnetic field, and wherein said size of said at least one of said sub-trays when maximally filled with said shim laminae allows said at least of said shim trays to be transported in a defined boundary region of said magnetic field with said magnetic field activated.

6. A shim tray as claimed in claim 1 for shimming a magnetic field having a homogeneity volume, and wherein at least one of said sub-trays has a dimension in said insertion direction that is greater than or equal to a comparable dimension of said homogeneity volume, and wherein said at least one of said shim trays having said dimension is adapted to be received in said receptacle at a position corresponding to a position of said homogeneity volume.

7. A shim tray as claimed in claim 1 wherein said plurality of sub-trays is odd.

8. A shim tray as claimed in claim 1 wherein said plurality of sub-trays is three.

9. A shim tray as claimed in claim 1 wherein said sub-trays are adapted to receive shim laminae for shimming a magnetic field, and wherein said shim tray is sub-divided into said plurality of said sub-trays at respective locations at which few of said shim laminae are required for shimming said magnetic field.

10. A shim tray as claimed in claim 1 wherein said adjacent sub-trays are respectively shaped to releasably connect said adjacent sub-trays.

11. A gradient coil system comprising a receptacle and a shim tray insertable into and removable from said receptacle, said shim tray being sub-divided into a plurality of sub-trays, said sub-trays in said plurality of sub-trays being disposed in succession in said insertion direction with adjacent sub-trays being releasably connected to each other for allowing individual removal of respective sub-trays from said receptacle.

12. A gradient coil system as claimed in claim 11 shaped as a hollow cylinder having a longitudinal cylinder axis, and wherein said receptacle has an unchanging cross-section along said longitudinal axis.

13. A magnetic resonance apparatus comprising a receptacle and a shim tray insertable into and removable from said receptacle, said shim tray being sub-divided into a plurality of sub-trays, said sub-trays in said plurality of sub-trays being disposed in succession in said insertion direction with adjacent sub-trays being releasably connected to each other for allowing individual removal of respective sub-trays from said receptacle.

14. A magnetic resonance apparatus as claimed in 13 having an examination space accessible from two sides, a support mechanism movable into and out of said examination space from a first of said sides, and wherein said shim tray is insertable into and removable from said receptacle from a second of said sides.

15. A magnetic resonance apparatus as claimed in claim 13 comprising a basic field magnet, and wherein said support mechanism is mounted to said basic field magnet.

16. A magnetic resonance apparatus as claimed in claim 13 comprising a basic field magnet which generates a basic magnetic field and wherein at least one of said sub-trays has a size adapted to be maximally filled with shim laminae for shimming said basic magnetic field, and wherein said size of said at least one of said sub-trays when maximally filled with said shim laminae allows said at least of said shim trays to be introduced and removed from said receptacle with said basic magnetic field activated.

17. A magnetic resonance apparatus as claimed in claim 13 comprising a basic field magnet which generates a basic magnetic field and wherein at least one of said sub-trays has a size adapted to be maximally filled with shim laminae for shimming said basic magnetic field, and wherein said size of said at least one of said sub-trays when maximally filled with said shim laminae allows said at least of said shim trays to be transported in a defined boundary region of said basic magnetic field with said basic magnetic field activated.

18. A magnetic resonance apparatus as claimed in claim 13 comprising a basic field magnet which generates a basic magnetic field having a homogeneity volume shimmed b laminae in said shim tray, and wherein at least one of said sub-trays has a dimension in said insertion direction that is greater than or equal to a comparable dimension of said homogeneity volume, and wherein said at least one of said shim trays having said dimension is adapted to be received in said receptacle at a position corresponding to a position of said homogeneity volume.

* * * * *